United States Patent
Yamaoka et al.

(10) Patent No.: US 7,088,107 B2
(45) Date of Patent: Aug. 8, 2006

(54) CIRCUIT PATTERN INSPECTION INSTRUMENT AND PATTERN INSPECTION METHOD

(75) Inventors: Shuji Yamaoka, Hiroshima (JP); Hiroshi Hamori, Hiroshima (JP); Shogo Ishioka, Hiroshima (JP)

(73) Assignee: OHT Inc., Hiroshima (JP)

( * ) Notice: Subject to any disclaimer, the term of this patent is extended or adjusted under 35 U.S.C. 154(b) by 0 days.

(21) Appl. No.: 10/536,996

(22) PCT Filed: Nov. 28, 2003

(86) PCT No.: PCT/JP03/15289

§ 371 (c)(1), (2), (4) Date: May 31, 2005

(87) PCT Pub. No.: WO2004/057350

PCT Pub. Date: Jul. 8, 2004

(65) Prior Publication Data

US 2006/0055413 A1 Mar. 16, 2006

(30) Foreign Application Priority Data

Nov. 30, 2002 (JP) ............................. 2002-382814

(51) Int. Cl.
*G01R 31/02* (2006.01)

(52) U.S. Cl. ....................................................... 324/537

(58) Field of Classification Search ................. 324/537
See application file for complete search history.

(56) References Cited

U.S. PATENT DOCUMENTS

| 5,266,901 A | * | 11/1993 | Woo ........................... 324/537 |
| 6,943,559 B1 | * | 9/2005 | Yamaoka et al. ........... 324/537 |
| 6,995,566 B1 | * | 2/2006 | Yamaoka et al. ........... 324/519 |

FOREIGN PATENT DOCUMENTS

| JP | 8-105926 | 4/1996 |
| JP | 2001-77163 | 3/2001 |
| JP | 2001-296326 | 10/2001 |
| JP | 2002-90407 | 3/2002 |

* cited by examiner

*Primary Examiner*—Anjan Deb
*Assistant Examiner*—John Teresinski
(74) *Attorney, Agent, or Firm*—Westerman, Hattori, Daniels & Adrian, LLP.

(57) ABSTRACT

Disclosed is a circuit pattern inspection apparatus for inspecting a conductive pattern of a circuit board which includes first and second comb-shaped conductive patterns (15a, 15b) each having a plurality of terminal portions arranged substantially parallel to each other and a base portion connecting respective anchor ends of the terminal portions together, wherein the terminal portions of the first comb-shaped conductive pattern are alternately arranged with respect to the terminal portions of said second comb-shaped conductive pattern, and the first second comb-shaped conductive patterns (15a, 15b) are adapted, respectively, to be supplied with an AC inspection signal, and grounded. The circuit pattern inspection apparatus having first and second detection means (20, 30) each having a detection electrode for detecting a signal from the first and second comb-shaped conductive patterns, and a scalar robot (80) operable to move each of the first and second detection means (20, 30) across common ones of the terminal portions, while allowing them be capacitively coupled with the terminal portions.

9 Claims, 3 Drawing Sheets

CIRCUIT PATTERN INSPECTION INSTRUMENT AND PATTERN INSPECTION METHOD

TECHNICAL FIELD

The present invention relates to a circuit pattern inspection apparatus and method adapted to inspect the presence of a defect in a conductive pattern formed on a board, such as a glass board for a liquid-crystal display panel.

BACKGROUND ART

In a manufacturing process for a circuit board having a conductive pattern formed thereon, it is necessary to inspect the presence of a defect, such as disconnection or short circuit, in the conductive pattern formed on the circuit board.

Heretofore, as a technique for inspecting a conductive pattern, there has been known a contact (pin contact) technique which comprises binging a plurality of pins into contact with first and second opposite ends of a conductive pattern, supplying an electric signal from the pins in contact with the first end to the conductive pattern, and receiving the electric signal from the pins in contact with the second end, so as to inspect continuity or other quality factor of the conductive pattern, as disclosed, for example, in the following Patent Publication 1. In this technique, a certain current serving as the electric signal is supplied to the conductive pattern from a plurality of metal pin probes which are put on respective end terminals of the conductive pattern.

The pin contact technique based on the pin probe set in direct contact with the end terminals has an advantage of being able to achieve a high S/N ratio.

However, the direct contact of the pins is likely to cause a problem about damages in a conductive pattern, particularly in a circuit wiring pattern formed on a glass board for a liquid-crystal panel, which has a small pattern thickness and a low fixing strength relative to the board.

Further, in an inspection of an electronic component, such as a liquid-crystal display panel for portable phones, where the wiring pitch of a conductive pattern becomes finer and finer, a number of pin probes having a fine pitch have to be prepared by consuming a great deal of time and cost.

In addition, the pin probe set has to be newly prepared for each circuit board (inspection target) having a conductive pattern different in configuration. This leads to increase in inspection cost, resulting in major hindrance to cost reduction of electronic components.

Particularly, as described in detail later, a conductive pattern for use in a liquid-crystal display panel includes first and second comb-shaped conductive patterns each having a plurality of terminal portions arranged substantially parallel to each other and a base portion connecting respective anchor ends of the terminal portions together, wherein the terminal portions of the first comb-shaped conductive pattern are alternately arranged with respect to the terminal portions of the second comb-shaped conductive pattern. The circuit board also includes another conductive pattern formed thereon to surround the first and second comb-shaped conductive patterns. That is, each of the conductive patterns is in a short-circuited state. Thus, any appropriate inspection apparatus for this type of circuit pattern has not been put into practical use.

Patent Publication 1: Japanese Patent Laid-Open Publication No. 62-269075

There is a strong need for providing a circuit pattern inspection technique for a liquid-crystal display panel having a low fixing force between a circuit pattern and a board, and achieving an inspection apparatus free from causing damages in the pattern.

DISCLOSURE OF INVENTION

In view of the above conventional problems, it is therefore an object of the present invention to provide a circuit pattern inspection apparatus and method capable of inspecting a circuit pattern for a liquid-crystal display panel having a low fixing force relative to a board thereof, without causing damages in the circuit pattern.

In order to achieve this object, according to a first aspect of the present invention, there is provided a circuit pattern inspection apparatus for inspecting a conductive pattern of a circuit board which includes first and second comb-shaped conductive patterns each having a plurality of terminal portions arranged substantially parallel to each other and a base portion connecting respective anchor ends of the terminal portions together, wherein the terminal portions of the first comb-shaped conductive pattern are alternately arranged with respect to the terminal portions of said second comb-shaped conductive pattern. The circuit pattern inspection apparatus comprises first and second detection means each having a detection electrode for detecting a signal from the first and second comb-shaped conductive patterns, inspection signal supply means for supplying an AC inspection signal to the first comb-shaped conductive pattern, low-voltage control means for controlling a voltage level of the second comb-shaped conductive pattern to be less than the level of the AC inspection signal supplied from the inspection signal supply means, and moving means for moving each of the first and second detection means across common ones of the terminal portions, while allowing each of the first and second detection means to be spaced apart from the terminal portions by a given distance so as to form a capacitive coupling therebetween. The moving means is adapted to move the first detection means across an anchor-end region of each terminal portion of the first comb-shaped conductive pattern supplied with the AC inspection signal and a tip-end region of each terminal portion of the second comb-shaped conductive pattern controlled at the lower-voltage level, and simultaneously move the second detection means across an anchor-end region of each terminal portion of the second comb-shaped conductive pattern and a tip-end region of each terminal portion of the first comb-shaped conductive pattern, whereby the first and second detection means generates detection signals allowing the presence of a defect in each of the first and second comb-shaped conductive patterns to be determined based thereon.

In the circuit pattern inspection apparatus of the present invention, the low-voltage control means may be adapted to control the voltage level of the second comb-shaped conductive pattern to be a ground level.

In the circuit pattern inspection apparatus of the present invention, at least each terminal portion of the first and second comb-shaped conductive pattern may have a given resistance value. In this case, the moving means may be adapted to move each of the first and second detection means across the terminal portions, while allowing each of the first and second detection means to be located adjacent to each tip end and anchor end of the terminals associated therewith.

According a second aspect of the present invention, there is provided a circuit pattern inspection method for use with a circuit pattern inspection apparatus for inspecting a conductive pattern of a circuit board which includes first and second comb-shaped conductive patterns each having a plurality of terminal portions arranged substantially parallel to each other and a base portion connecting respective anchor ends of the terminal portions together, wherein the terminal portions of the first comb-shaped conductive pattern are alternately arranged with respect to the terminal portions of the second comb-shaped conductive pattern, and the circuit pattern inspection apparatus includes first and second detection means each having a detection electrode for detecting signals from the first and second comb-shaped conductive patterns. The method comprises: supplying an AC inspection signal to the first comb-shaped conductive pattern, and allowing the second comb-shaped conductive pattern to have a voltage level less than the level of the AC inspection signal supplied to the first comb-shaped conductive pattern; and moving the first detection means across an anchor-end region of each terminal portion of the first comb-shaped conductive pattern supplied with the AC inspection signal and a tip-end region of each terminal portion of the second comb-shaped conductive pattern having the lower-voltage level, and simultaneously move the second detection means across an anchor-end region of each terminal portion of the second comb-shaped conductive pattern and a tip-end region of each terminal portion of the first comb-shaped conductive pattern, so as to determine the presence of a defect in each of the first and second comb-shaped conductive patterns in accordance with respective detection signals from the first and second detection means.

In the circuit pattern inspection method of the present invention, when at least each terminal portion of the first and second comb-shaped conductive pattern may have a given resistance value, the circuit pattern inspection method may include moving each of the first and second detection means across the terminal portions, while allowing each of the first and second detection means to be located adjacent to each tip end and anchor end of the terminals associated therewith.

The circuit pattern inspection method of the present invention may include allowing the second comb-shaped conductive pattern to have a low voltage level.

The circuit pattern inspection method of the present invention may include, based on a detection result that each of the first and second detection means generates a detection signal having a high level when they are moved across each terminal portion of the first comb-shaped conductive pattern supplied with the AC inspection signal, and each of the first and second detection means generates a detection signal having a low level when they are moved across each terminal portion of the second comb-shaped conductive pattern controlled at the lower-voltage level, determining the first and second comb-shaped conductive patterns are normal.

Further, the above circuit pattern inspection method may include: based on a detection result that each of the first and second detection means generates a detection signal having a high level when they are moved across each terminal portion of the second comb-shaped conductive pattern controlled at the lower-voltage level, determining that the first comb-shaped conductive pattern supplied with the inspection signal is short-circuited around at least one of the anchor ends of the terminal portions thereof; and based on a detection result that each of the first and second detection means generates a detection signal having a low level when they are moved across each terminal portion of the first comb-shaped conductive pattern supplied with the inspection signal, determining that the second comb-shaped conductive pattern controlled at the lower-voltage level is short-circuited around at least one of the anchor ends of the terminal portions thereof.

The above circuit pattern inspection method may include: based on a detection result that a detection signal of the first detection means generated when moved across a specific one of the terminal portions of the second comb-shaped conductive pattern controlled at the lower-voltage level has a higher level than that of a detection signal of the first detection means generated when moved across each terminal portion of the first comb-shaped conductive pattern supplied with the inspection signal, and a detection signal of the second detection means generated when moved across the specific terminal together with the first detection means has a lower level than that of a detection signal of the second detection means generated when moved across another terminal portion of the second comb-shaped conductive pattern, determining that the specific terminal portion of the second comb-shaped conductive pattern is disconnected; and based on a detection signal that a detection signal of the first detection means generated when moved across a specific one of the terminal portions of the first comb-shaped conductive pattern supplied with the inspection signal has a higher level than that of a detection signal of the first detection means when moved across another terminal of the first comb-shaped conductive pattern, and a detection signal of the second detection means generated when moved across the specific terminal together with the first detection means has a lower level than that of a detection signal of the second detection means generated when moved across each terminal portion of the second comb-shaped conductive pattern controlled at the lower-voltage level, determining that the specific terminal portion of the first comb-shaped conductive pattern is disconnected.

BEST MODE FOR CARRYING OUT THE INVENTION

With reference to the drawings, an embodiment of the present invention will now be described in detail.

While the following description will be made on the assumption that a circuit pattern inspection apparatus according to the embodiment is designed to inspect the presence of a defect in a dot-matrix pattern formed on a circuit board before being incorporated in a dot-matrix liquid-crystal display panel, the present invention is not limited to the following embodiment, but may be applied to inspection for any circuit board having comb-shaped conductive patterns.

FIRST EMBODIMENT

Figure 1:
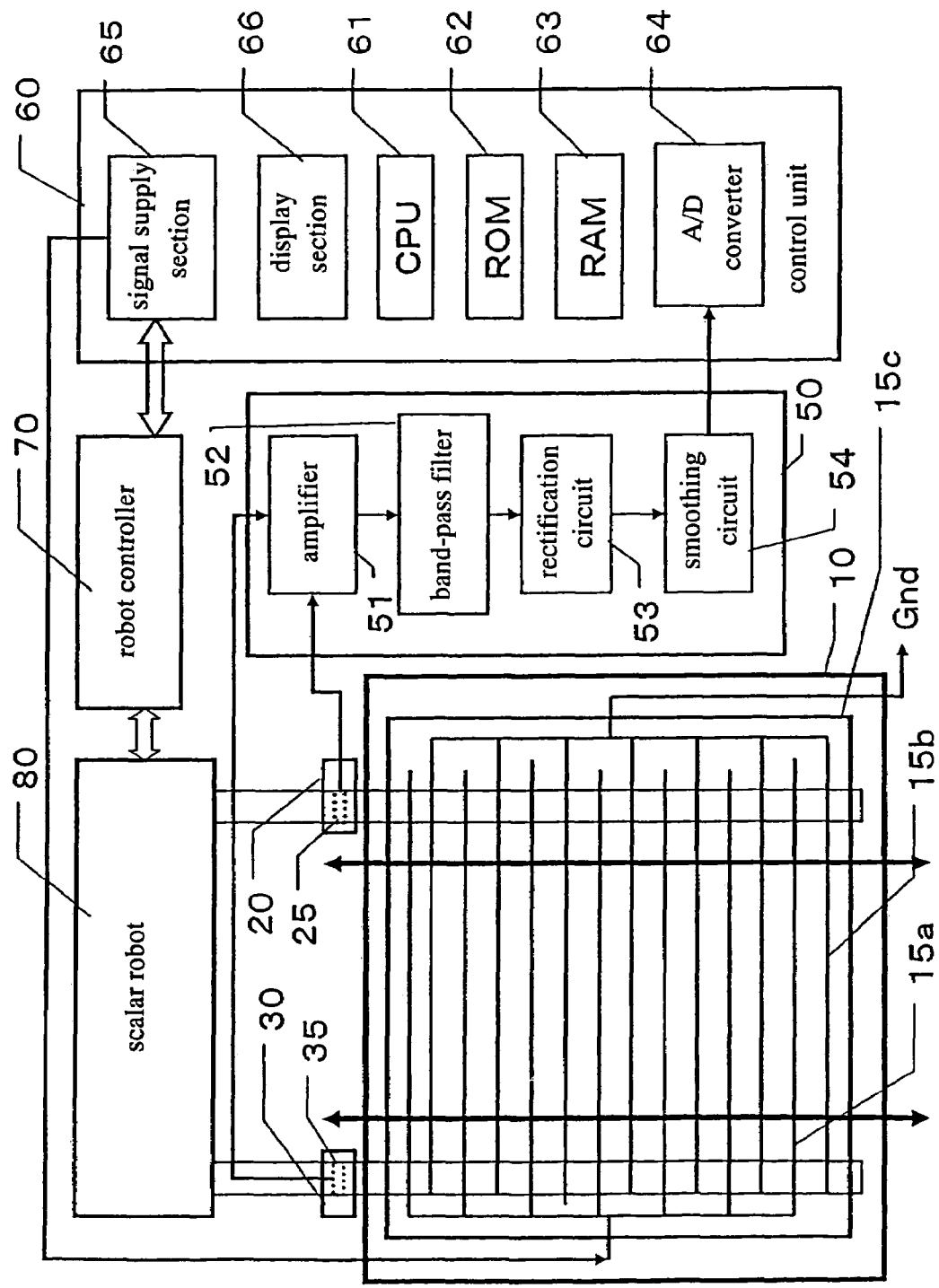
FIG. 1 is an explanatory diagram of the principle of inspecting a conductive pattern in a circuit pattern inspection apparatus according to an embodiment of the present invention.

FIG. 1 is an explanatory diagram of the principle of inspecting a conductive pattern in a circuit pattern inspection apparatus according to a first embodiment of the present invention.

In FIG. 1, the reference numeral 10 indicates a circuit board formed with a conductive pattern to be inspected by the inspection apparatus according to the first embodiment. In this embodiment, the circuit board 10 is a glass circuit board for use in a dot-matrix liquid-crystal display panel.

The conductive pattern includes first and second comb-shaped conductive patterns 15a, 15b each having a plurality of terminal portions arranged in lines or substantially parallel to each other and a base portion connecting respective anchor ends of the terminal portions together. The terminal portions of the first comb-shaped conductive pattern are alternately arranged with respect to the terminal portions of the second comb-shaped conductive pattern. The conductive pattern also includes a shield pattern 15c surrounding the first and second comb-shaped conductive patterns.

In the conductive patterns for a liquid crystal panel illustrated in FIG. 1, each of the first and second comb-shaped conductive patterns 15a, 15b has approximately the same pattern width, and each of the parallel patterns (terminal portions) has a given resistance value.

While the parallel patterns of the first and second comb-shaped conductive patterns in this embodiment are arranged at approximately even intervals, the inspection apparatus according to the this embodiment can perform an adequate inspection even if the conductive patterns are arranged at uneven intervals.

The reference numeral 20 indicates a first sensor, and the reference numeral 30 indicates a second sensor. A sensor electrode 25 is provided on at least a top surface of the first sensor 20, and a sensor electrode 35 is provided on at least a top surface of the second sensor 30. Each of the sensor electrodes 25, 35 are made of metal, such as copper (Cu), and may be coated with a protective insulating material. While each of the sensor electrodes 25, 35 may be made of a material other than metal, such as semiconducting material, the metal electrode makes it possible to obtain a larger electrostatic capacity relative to the conductive patterns.

The reference numeral 50 indicates an analog signal processor for processing a detection signal from each of the sensor electrodes 25, 35 of the first and second sensors 20, 30 and sending the processed signal to a control unit 60 for generally governing the control of the inspection apparatus. The reference numeral 70 indicates a robot controller for controlling a scalar robot 80 which is operable to move and hold the circuit board 10 to/in an inspection zone, and then scanningly move the sensor electrode 25, 35 of the first and second sensors 20, 30 sequentially across each tip end and anchor end of the parallel patterns of the first and second comb-shaped conductive patterns, under the control of the robot controller 70.

In this embodiment, the scalar robot 80 has a three-dimensional positioning function for moving and holding the circuit board 10 to/in a given inspection zone, and moving the sensor electrode 25, 35 of the first and second sensors 20, 30 above each of the parallel patterns with a given distance relative to the surface of the circuit board 10.

In an actual inspection, the sensor electrodes 25, 35 have to be synchronizingly moved to be located above a common one of the parallel patterns approximately simultaneously and then left from the common parallel pattern approximately simultaneously. According to this control, even if opposite ends of the comb-shaped conductive patterns are arranged at uneven intervals or different in pattern pitch, an adequate inspection can be performed by simply controlling the scalar robot to adjust respective movement speeds of the sensor electrodes.

The scalar robot 80 moves each of the first and second sensors 20, 30 across each tip-end region and anchor-end region of the parallel patterns, while allowing the first and second sensors 20, 30 to be capacitively coupled with each of the parallel patterns. Preferably, each outermost surface of the sensor electrode 25, 35 has a width equal to or less than one pitch of the parallel patterns (or a width equal to or less than the sum of the width of one parallel pattern and the interval or distance between the adjacent parallel patterns). In this case, a detection signal can be detected substantially from only one parallel pattern.

However, it is not essential for each of the sensor electrodes 25, 35 to have a width equal to or less than one pitch of the parallel patterns. Specifically, in order to perform an adequate inspection in such a case, the inspection apparatus may be designed to have a sensor section capable of figuring out each state of two or more of the parallel patterns and the parallel patterns adjacent thereto.

A detection signal from each of the first and second sensors 20, 30 is sent to the analog signal processor 50, and subjected to an analog signal processing therein. The processed analog signal is sent from the analog signal processor 50 to the control unit 60 to determine the presence of a defect in the first and second comb-shaped conductive patterns of the glass board 10. The control unit 60 is also operable to controllably supply the inspection signal to the first comb-shaped conductive pattern.

The analog signal processor 50 comprises an amplifier 51 for amplifying the detection signals from the first and second sensors 20, 30 independently, a band-pass filter 52 for eliminating noise components of each amplified detection signal from the amplifier 51 and outputting the filtered detection signal, a rectification circuit 53 for full-wave-rectifying the filtered detection signal from the band-pass filter 52, and a smoothing circuit 54 for smoothing the full-wave-rectified detection signal from the rectification circuit 53. In the analog signal processor 50, the rectification circuit 53 for full-wave rectification may be omitted.

The control unit 60 for generally governing the control of the inspection apparatus comprises a central processor (CPU) 61, a ROM 62 for storing a control program to be executed by the CPU 61 and others, a RAM 63 for temporarily storing information about progress of processing in the CPU 61, an A/D converter 64 for converting the analog signal from the analog signal processor 50 to a corresponding digital signal, a signal supply section 65 for supplying an inspection signal to the base portion of the first comb-shaped conductive pattern, and a display section 66 for displaying an inspection result, an operational instruction/guidance and others.

The signal supply section 65 generates an inspection signal having, for example, of an AC sine wave of 200 kHz and 200 V, and supplies the inspection signal to the base portion of the first comb-shaped conductive pattern. In this case, the band-pass filter 52 is set to allow the inspection signal having a given frequency, such as 200 kHz, to pass therethrough.

The base portion of the second comb-shaped conductive pattern supplied with no inspection signal is maintained at a ground level. The voltage level in the base portion of the second comb-shaped conductive pattern is not limited to the ground level, but may be any suitable value less than the level of the inspection signal to be supplied to the base portion of the first comb-shaped conductive pattern. Thus, when a signal having a lower level than that of the inspection signal supplied to the base portion of the first comb-shaped conductive pattern is supplied to the base portion of the second comb-shaped conductive pattern, a certain difference occurs between respective detection results of the first and second sensors 20, 30, and the presence of a defect in the comb-shaped conductive patterns can be determined based on these different detection results in the same manner as that for a usual circuit pattern.

Figure 2:
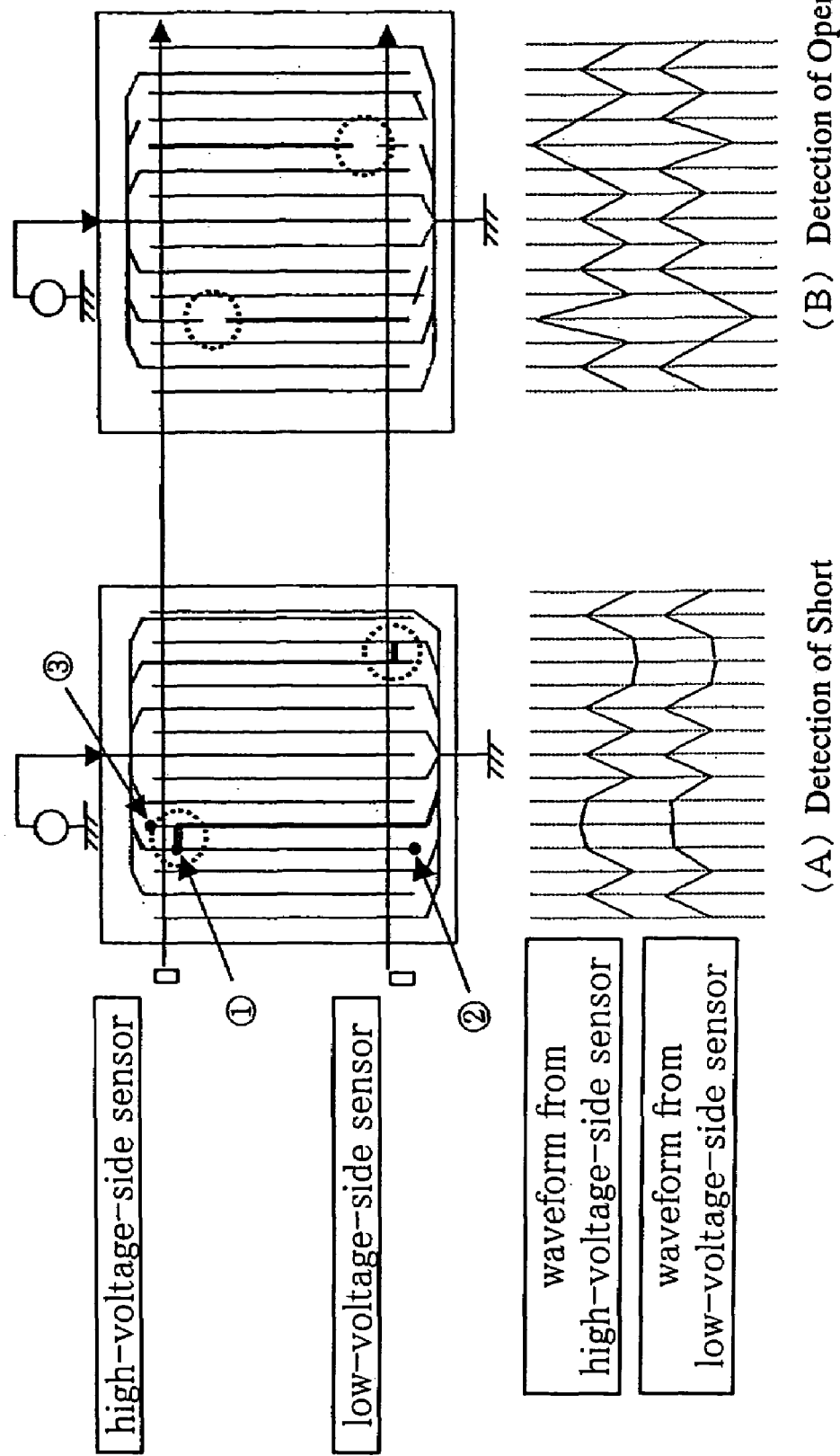
FIGS. 2(A) and 2(B) are explanatory diagrams of the principle of determining the presence of a defect in a conductive pattern in the circuit pattern inspection apparatus.

With reference to FIGS. 2(A) and 2(B), the principle of determining the presence of a defect in the comb-shaped conductive patterns in the inspection apparatus according to this embodiment will be described below. FIGS. 2(A) and 2(B) show examples of detection signals from the sensors of the inspection apparatus according to this embodiment, where FIG. 2(A) shows detections signal obtained when the comb-shaped conductive patterns includes a short-circuited region, and FIG. 2(B) shows detection signals obtained when the comb-shaped conductive patterns includes a disconnected region.

In the inspection apparatus according to this embodiment, each of the parallel patterns has a given resistance value, and each of the first and second sensors 20, 30 is capacitively coupled with each of the parallel patterns. The obtained detection result is not a digital-like form, but a certain level of detection result can be obtained even in the space between the adjacent parallel patterns. Specifically, as indicated by the arrows in FIGS. 2(A) and 2(B), the scalar robot 80 moves each of the first and second sensors 20, 30 across each tip-end region and anchor-end region of the parallel patterns of the first and second comb-shaped conductive patterns, while allowing the first and second sensors 20, 30 to be capacitively coupled with each of the parallel patterns. During this movement, the first and second sensors 20, 30 are synchronizingly moved at a speed corresponding to the pattern pitch to be located above a common one of the parallel pattern at approximately the same timing and then left from the common parallel patterns at approximately the same timing.

Thus, in a normal pattern region, most of the current of the inspection signal supplied from the signal supply section 65 flows to the ground side through the short pattern (ring-shaped short portion) 15c.

As shown in FIG. 2(A), when there is a short-circuited (short) region between the tip-end region of one parallel pattern of the second comb-shaped conductive pattern having the ground level and the anchor-end region of one adjacent parallel pattern of the first comb-shaped conductive pattern supplied with the inspection signal, a new current path as indicated by the thick line in FIG. 2(A) is formed to thereby provide a detection signal as shown in the lower portion of FIG. 2(A). A potential of the thick-lined parallel pattern is proportionally reduced toward the grounded base portion.

Thus, in FIG. 2(A), respective potentials at the positions (1), (2) and (3) become approximately equal to each other. Further, each of the potentials at the positions (2) and (3) has an approximately fixed value depending on the short position (1). Specifically, each of the potentials at the positions (2) and (3) is increased as the short position (1) is located closer to the anchor end of the parallel pattern or the base portion of the first comb-shaped conductive pattern supplied with the inspection signal (higher-voltage side), and each of the potentials at the positions (2) and (3) is reduced as the short position (1) is located closer to the anchor end of the parallel pattern or the base portion of the second comb-shaped conductive pattern (lower-voltage side).

That is, when each of the potentials at the positions (2) and (3) is high, it can be determined that the parallel pattern has a short region located adjacent to the base portion of the first comb-shaped conductive pattern supplied with the inspection signal. Further, when each of the potentials at the positions (2) and (3) is low, it can be determined that the parallel pattern has a short region located adjacent to the base portion of the second comb-shaped conductive pattern having the ground level (lower-voltage side).

Practically, this detection level and the short position have a correspondence relationship, and a short position can be roughly specified based on the detection level. Thus, even in an inspection of a fine pattern, a short position can be readily specified.

When each parallel patterns is in a normal state, an AC current of the inspection signal flowing through the first comb-shaped conductive pattern supplied with the inspection signal (higher-voltage side) constantly flows into the second comb-shaped conductive pattern having the ground level (lower-voltage side) through a capacitive component with the adjacent parallel pattern of the second comb-shaped conductive pattern. However, when one parallel pattern has a partially discontinued region, a detection result as shown in FIG. 2(A) will be obtained.

For example, one parallel pattern of the first comb-shaped conductive pattern supplied with the inspection signal is in a disconnected (open) state, a current to flow into the second comb-shaped conductive pattern having the ground level (lower-voltage side) is reduced, and thereby an potential to be detected by the first sensor 20 is increased. Thus, an inspection output from the first sensor 20 is increased. On the other hand, no current flows through a thick-lined region of the parallel pattern on the side of the tip end thereof, and thereby an output of the second sensor 20 located on the lower-voltage side is reduced.

Thus, when an output of the first sensor 20 at a specific one of the parallel patterns of the first comb-shaped conductive pattern supplied with the inspection signal has a higher level than that of an output of the first sensor 20 at another normal parallel pattern of the first comb-shaped conductive pattern, and an output of the second sensor at the specific parallel pattern has a lower level than that of an output of the second sensor at each normal parallel pattern of the second comb-shaped conductive pattern, the specific parallel pattern of the first comb-shaped conductive pattern is determined to be disconnected.

When each parallel pattern is in a normal state, a current constantly flows into the second comb-shaped conductive pattern having the ground level through a capacitive component between the adjacent parallel patterns. When one parallel pattern of the second comb-shaped conductive pattern having the ground level is in a disconnected state, a thick-lined region of the disconnected parallel pattern is changed from the grounded state to a float state, and thereby affected by the adjacent parallel patterns to have a higher potential. Thus, an output of the first sensor 20 is increased. On the other hand, the thick-lined region of the disconnected parallel pattern does not affect on the remaining region associated with the second sensor 30, and thereby the influence from the adjacent parallel patterns on the remaining region is reduced. Therefore, an output of the second sensor is reduced.

Thus, when an output of the first sensor 20 at a specific one of the parallel patterns of the second comb-shaped conductive pattern having the ground level has a higher level than that of an output of the first sensor 20 at each parallel pattern of the first comb-shaped conductive pattern, and an output of the second sensor 30 has a lower level than an output of the second sensor 30 at another parallel pattern of the second comb-shaped conductive pattern, the specific parallel pattern of the second comb-shaped conductive pattern is determined to be disconnected.

When each parallel pattern is in the disconnected state, each output level of the first and second sensors is also determined by an open (disconnected) position in the parallel pattern. Thus, the open position can be roughly specified based on the detection level.

In the process for specifying an open position, a reference detection result for various standard patterns and various open or short position may be pre-stored, and a detective position may be specified by the comparison between the pre-stored reference detection result and an actual detection result.

Figure 3:
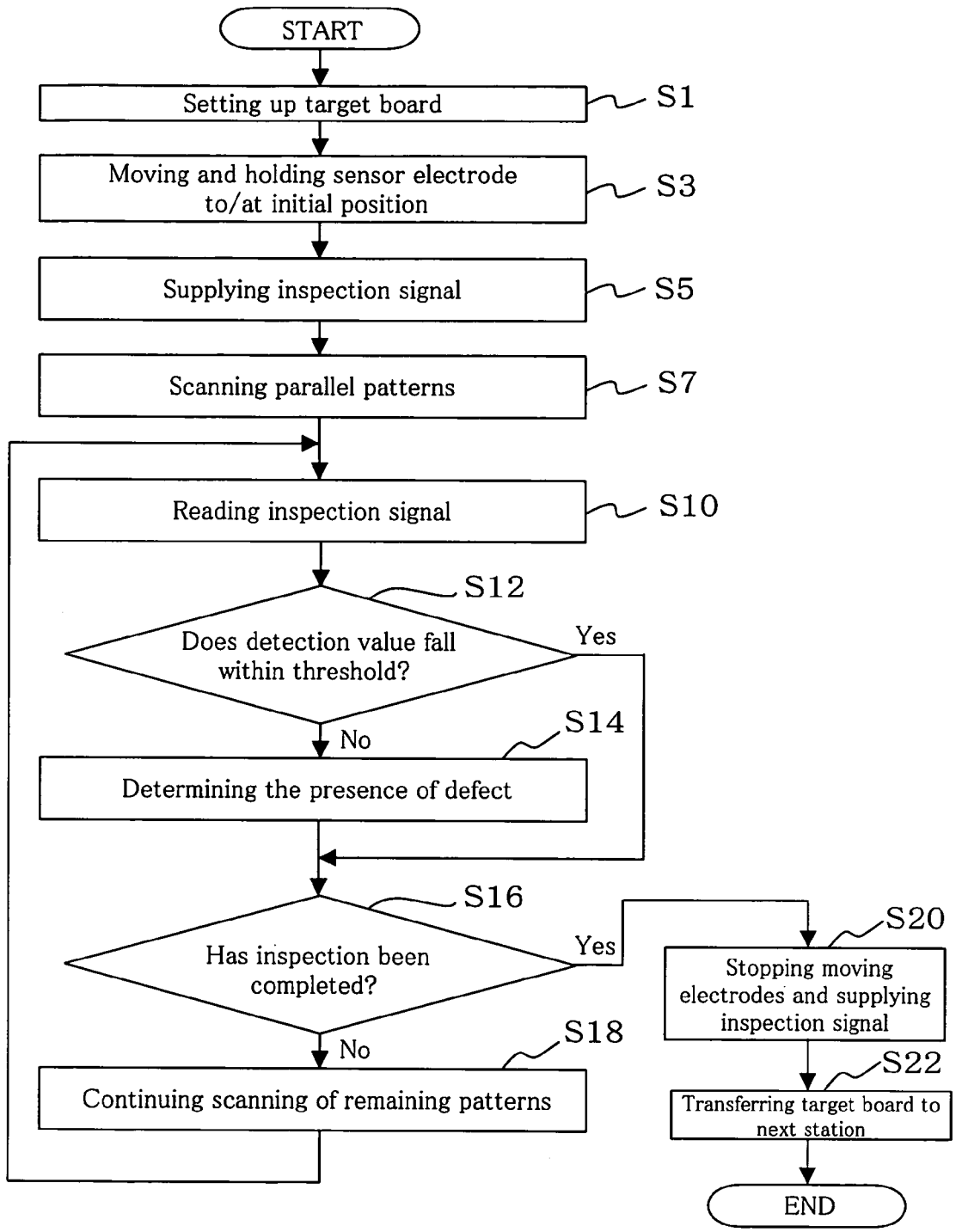
FIG. 3 is a flowchart of an inspection control process in the circuit pattern inspection apparatus.

With reference to the flowchart illustrated in FIG. 3, a control process of inspecting the comb-shaped conductive patterns in the above inspection apparatus according to this embodiment will be described below.

In the inspection process using the inspection apparatus according to this embodiment, the glass board 10 formed with the comb-shaped conductive patterns is transferred along a transfer path to a station for the circuit pattern inspection apparatus (work station). Then, in Step S1, the circuit board 10 (hereinafter referred to as "target board") is set up in the inspection apparatus. The automatically transferred target board may be automatically set up in the inspection apparatus using a transfer robot (not shown) or may be manually set up in the inspection apparatus by an operator. Upon completion of the setting of the target board in the inspection apparatus, the control unit 60 activates the robot controller 70 to control the scalar robot 80 so as to move and hold the target board to/in an inspection zone.

Subsequently, in Step S3, the sensor electrode 25 of the first sensor 20 is moved to an initial position on the side of the base portion of the first comb-shaped conductive pattern 15a of the target board 10 (a position spaced apart upward from the uppermost parallel pattern by a given distance), and the electrode 30 of the second sensor 30 is moved to an initial position on the side of the base end of the second comb-shaped conductive pattern (a position spaced apart upward from the uppermost parallel pattern by a given distance).

In this embodiment, the distance or gap between each parallel pattern and each electrode 25, 35 is maintained in a given range, for example, of 100 to 200 µm. The gap is determined by the size of the parallel pattern, and thereby the value of the gap is not limited to the above range. Specifically, the gap may be set at a larger value as the size of the parallel pattern becomes larger, and should be set at a smaller value as the size of the parallel pattern becomes smaller.

If the conductive patterns are firmly fixed onto the surface of the target board, each surface of the electrodes may be coated with an insulating material to prevent a direct contact between the parallel pattern and the electrode. In this case, the insulation material may be formed to have a thickness approximately equal to the gap or to allow the first sensor 20 or the second sensor 30 to be brought into direct contact with the target board through the insulating material. This makes it possible to maintain the distance between each parallel pattern and each electrode at a constant value readily and accurately during inspection. Alternatively, each sensor may be spaced apart from the target board during a moving process of the sensor, and then brought into direct contact with the target board during a signal detection process. This makes it possible to readily obtain an accurate inspection result.

Subsequently, in Step S5, the CPU 61 instructs the signal supply section 65 to start to supply the inspection signal to the base portion of the first comb-shaped conductive pattern.

Then, the process advances to Step S7 to start a control for synchronizingly moving the electrodes 25, 35 of the first and second sensors 20, 30 across each parallel patterns while maintaining the distance between each parallel pattern and each electrode 25, 35 at a constant value. Under this control, each of the electrodes 25, 35 will sequentially detect a signal potential from each of the parallel patterns through the capacitive coupling therebetween.

Specifically, the electrode 25 is controllably moved in such a manner that, when the electrode 35 is located above a specific one of the parallel patterns, the electrode 25 is also located above the specific parallel pattern. Further, when the electrode 25 is controllably moved by one pitch of the parallel patterns, the electrode 35 is also moved by one pitch of the parallel patterns.

Simultaneously, in Step S10, the signal processor 50 is activated to process respective detection signals from the electrode 25, 35 independently, and send the processed detection signals to the control unit 60. As described above, in the signal processor 50, the amplifier 51 amplifies each of the detection signals from the electrodes 25, 35 of the first and second sensors 20, 30 up to a required level, and sends the amplified detection signal to the band-pass filter 52 to pass therethrough only frequency components corresponding to those of the detection signal so as to eliminate noise components. Then, the rectification circuit 53 full-wave-rectifies the filtered detection signal from the band-pass filter 52, and the smoothing circuit 54 smoothes the full-wave-rectified detection signal and sends the smoothed detection signal to the A/D converter 64.

The CPU 61 activates the A/D converter 64 to convert the input analog signal to a corresponding digital signal, and reads the detection signal detected by each of the electrodes 25, 35 in the form of a digital value.

Then, in Step S12, the CPU 61 checks whether the read detection signals fall within a given threshold range. When the detection result falls within the threshold range, the detected parallel pattern is determined to be normal, and the process advances to Step S16.

If the read detection signals are out of the threshold range, the parallel pattern associated with the detection signals is determined to be short-circuited with the adjacent parallel pattern or disconnected, and the state of this parallel pattern is stored as defective. Then, the process advances to Step S16.

The disconnection or short-circuit in each parallel pattern and a defective position in the parallel pattern are determined according to the aforementioned principle.

In Step S16, the CPU 61 determines whether all of the parallel patterns have been inspected, for example, whether the electrode 25 has been moved to a position beyond the last parallel pattern (whether the inspection of the circuit pattern has been completed).

If the inspection of a part of the parallel patterns has not been completed, the process will advance to Step S18 to continue scanningly moving the electrodes and supply the inspection signal to the remaining parallel patterns. Then, the process will return to Step S10 to continue the read operation.

When the determination in Step S16 is YES or it is determined that all of the parallel patterns have been inspected, the process advances to Step S20. In Step S20, the CPU 61 instructs the signal supply section 65 to stop supplying the inspection signal, and instructs the signal processor 50 and the A/D converter 64 to stop their operations.

Lastly, in Step S22, the target board is taken out of the inspection zone. Then, the circuit board is positioned at a transfer position, and transferred to a next station to perform a required remaining operation.

According to the above inspection process, the inspection of a conductive pattern on a circuit board for a liquid-crystal display panel can be performed in a non-contact manner. This allows the circuit board having low-strength patterns to be inspected without any problems.

Thus, while a glass circuit board for a liquid-crystal display panel to be used in small portable phones has difficulties in ensuring a sufficient strength in wiring patterns, even such wiring patterns can be reliably inspected without damage thereof.

As described above, the inspection apparatus according to this embodiment makes it possible to readily achieve a reliable circuit pattern inspection.

SECOND EMBODIMENT

The aforementioned embodiment is designed to move the electrodes 25, 35 across each end of the parallel patterns in a non-contact manner so as to detect a defective parallel pattern. However, the present invention is not limited to this embodiment. For example, when the comb-shaped conductive patterns have a sufficient strength, such as frictional strength, a blush made of a conductive material may be attached to each lower surface of the first and second sensors 20, 30 opposed to the parallel patterns. In this case, each of the first and second sensors 20, 30 is moved in such a manner that the blush sweeps each surface of the parallel pattern to detect a signal therefrom. This makes it possible to more clearly detect the presence of short-circuit and disconnection.

Further, the inspection apparatus according to the first embodiment is designed to move the electrodes 25, 35 2-dimensionally or in the X-Y directions. This control is performed because the target board is a circuit board for a liquid-crystal panel, and a glass circuit board having a high degree of flatness. In an inspection of a circuit board formed with a conductive pattern having a large thickness, or a large circuit board inevitably having irregularities in a surface thereof, the inspection apparatus may be designed to move the electrode 25, 35 not only 2-dimensionally but also in a vertical (Z) direction, so as to obtain an adequate inspection result regardless of the presence of irregularities in the surface of the target board.

In the 3-dimensional control, the scalar robot 80 is designed to move each of the first and second sensors 20, 30 2-dimensionally and in a direction perpendicular to the drawing sheet (a vertical direction).

Further, the inspection apparatus may be designed as follows. Each of the first and sensors 20, 30 is provided with a laser displacement measurement device, and the control unit 60 picks up a detection result from each of the displacement measurement devices attached to the sensors to measure a distance between each of the first and sensors 20, 30 and the target board. Then, the control unit 60 instructs the scalar robot 80 to adjust a distance between each of the first and sensors 20, 30 and the target board at a constant value according to the measurement result of laser displacement measurement device. During this Z-direction control, the control unit 60 is operable to average the measurement result obtained by the gap measurement in a period where each of the electrodes is moved by a given distance, and control the gap between each of the electrodes and each of the parallel patterns in such a manner that the averaged gap is maintained at a constant value.

For example, the gap between each of the electrodes and the surface of the target board is controlled in accordance with an averaged gap of the measurement result obtained in a period where each of the electrodes is moved by a distance between the three adjacent parallel patterns The averaging of the measured gaps is performed for moving the electrodes at a moderate speed in the Z-direction without an excessively rapid control, and reducing an adverse affect, such as noises or measurement error.

The 3-dimensional or X, Y, Z-control is effective, particularly, in an inspection of large circuit boards. For example, while a circuit board for a large flat display panel has difficulties in avoiding a curvature of a surface thereof, the 3-dimensional control can effectively prevent the contact between each of the electrodes and parallel patterns on the surface of the circuit board during inspection.

Further, if the parallel patterns have a large thickness, the distance for measuring gaps to be averages may be reduced to provide enhanced detection sensitivity.

While the present invention has been described in connection with the inspection apparatus for a circuit board used in a liquid-crystal display panel, the present invention is not limited to the above board, but may be applied to any other type of boards having comb-shaped conductive patterns.

INDUSTRIAL APPLICABILITY

As mentioned above, according to the present invention, the presence of a defect in conductive patterns can be reliably detected.

Further, even if conductive patterns are fragile, they can be reliably inspected without damages.

What is claimed is:

1. A circuit pattern inspection apparatus for inspecting a conductive pattern of a circuit board, said conductive pattern including first and second comb-shaped conductive patterns each of which has a plurality of terminal portions arranged substantially parallel to each other and an integral base portion connecting respective anchor ends of said terminal portions together, the terminal portions of said first comb-shaped conductive pattern being alternately arranged with respect to the terminal portions of said second comb-shaped conductive pattern, said circuit pattern inspection apparatus comprising:

first and second detection means each having a detection electrode for detecting a signal from said first and second comb-shaped conductive patterns;

inspection signal supply means for supplying an AC inspection signal to said first comb-shaped conductive pattern;

low-voltage control means for controlling a voltage level of said second comb-shaped conductive pattern to be less than the level of said AC inspection signal supplied from said inspection signal supply means; and moving means for moving each of said first and second detection means across said terminal portions, while allowing each of said first and second detection means to be spaced apart from said terminal portions by a given distance so as to form a capacitive coupling therebetween, wherein said moving means is adapted to move said first detection means across an anchor-end region of each terminal portion of said first comb-shaped conductive pattern supplied with said AC inspection signal and a tip-end region of each terminal portion of said second comb-shaped conductive pattern controlled at said lower-voltage level, and simultaneously move said second detection means across an anchor-end region of each terminal portion of said second comb-shaped conductive pattern and a tip-end region of each terminal portion of said first comb-shaped conductive pattern, whereby said first and second detection means generates detection signals allowing the presence of a defect in each of said first and second comb-shaped conductive patterns to be determined based thereon.

2. The circuit pattern inspection apparatus as defined in claim 1, wherein said low-voltage control means is adapted to control the voltage level of said second comb-shaped conductive pattern to be a ground level.

3. The circuit pattern inspection apparatus as defined in claim 1 or 2, wherein:
at least each terminal portion of said first and second comb-shaped conductive pattern has a given resistance value; and
said moving means is adapted to move each of said first and second detection means across said terminal portions, while allowing each of said first and second detection means to be located adjacent to each tip end and anchor end of said terminals associated therewith.

4. A circuit pattern inspection method for use with a circuit pattern inspection apparatus for inspecting a conductive pattern of a circuit board, said conductive pattern including first and second comb-shaped conductive patterns each of which has a plurality of terminal portions arranged substantially parallel to each other and a base portion connecting respective anchor ends of said terminal portions together, the terminal portions of said first comb-shaped conductive pattern being alternately arranged with respect to the terminal portions of said second comb-shaped conductive pattern, said circuit pattern inspection apparatus including first and second detection means each having a detection electrode for detecting signals from said first and second comb-shaped conductive patterns, said method comprising:
supplying an AC inspection signal to said first comb-shaped conductive pattern, and allowing said second comb-shaped conductive pattern to have a voltage level less than the level of said AC inspection signal supplied to said first comb-shaped conductive pattern; and
moving said first detection means across an anchor-end region of each terminal portion of said first comb-shaped conductive pattern supplied with said AC inspection signal and a tip-end region of each terminal portion of said second comb-shaped conductive pattern having said lower-voltage level, and simultaneously move said second detection means across an anchor-end region of each terminal portion of said second comb-shaped conductive pattern and a tip-end region of each terminal portion of said first comb-shaped conductive pattern, so as to determine the presence of a defect in each of said first and second comb-shaped conductive patterns in accordance with respective detection signals from said first and second detection means.

5. The circuit pattern inspection method as defined in claim 4, wherein at least each terminal portion of said first and second comb-shaped conductive pattern has a given resistance value, wherein said circuit pattern inspection method includes moving each of said first and second detection means across said terminal portions, while allowing each of said first and second detection means to be located adjacent to each tip end and anchor end of said terminals associated therewith.

6. The circuit pattern inspection method as defined in claim 4 or 5, which includes allowing said second comb-shaped conductive pattern to have a low voltage level.

7. The circuit pattern inspection method as defined in claim 4 or 5, which includes, based on a detection result that each of said first and second detection means generates a detection signal having a high level when they are moved across each terminal portion of said first comb-shaped conductive pattern supplied with said AC inspection signal, and each of said first and second detection means generates a detection signal having a low level when they are moved across each terminal portion of said second comb-shaped conductive pattern controlled at said lower-voltage level, determining said first and second comb-shaped conductive patterns are normal.

8. The circuit pattern inspection method as defined in claim 7, which includes:
based on a detection result that each of said first and second detection means generates a detection signal having a high level when they are moved across each terminal portion of said second comb-shaped conductive pattern controlled at said lower-voltage level, determining that said first comb-shaped conductive pattern supplied with said inspection signal is short-circuited around at least one of the anchor ends of the terminal portions thereof; and
based on a detection result that each of said first and second detection means generates a detection signal having a low level when they are moved across each terminal portion of said first comb-shaped conductive pattern supplied with said inspection signal, determining that said second comb-shaped conductive pattern controlled at said lower-voltage level is short-circuited around at least one of the anchor ends of the terminal portions thereof.

9. The circuit pattern inspection method as defined in claim 7, which includes:
based on a detection result that a detection signal of said first detection means generated when moved across a specific one of the terminal portions of said second comb-shaped conductive pattern controlled at said lower-voltage level has a higher level than that of a detection signal of said first detection means generated when moved across each terminal portion of said first comb-shaped conductive pattern supplied with said inspection signal, and a detection signal of said second detection means generated when moved across said specific terminal together with said first detection means has a lower level than that of a detection signal of said second detection means generated when moved across another terminal portion of said second comb-shaped conductive pattern, determining that said specific terminal portion of said second comb-shaped conductive pattern is disconnected; and
based on a detection signal that a detection signal of said first detection means generated when moved across a specific one of the terminal portions of said first comb-shaped conductive pattern supplied with said inspection signal has a higher level than that of a detection signal of said first detection means when moved across another terminal of said first comb-shaped conductive pattern, and a detection signal of said second detection means generated when moved across said specific terminal together with said first detection means has a lower level than that of a detection signal of said second detection means generated when moved across each terminal portion of said second comb-shaped conductive pattern controlled at said lower-voltage level, determining that said specific terminal portion of said first comb-shaped conductive pattern is disconnected.

* * * * *